United States Patent [19]

Nicholes et al.

[11] Patent Number: 5,373,203
[45] Date of Patent: Dec. 13, 1994

[54] DECODER AND LATCHING CIRCUIT WITH DIFFERENTIAL OUTPUTS

[75] Inventors: James W. Nicholes, Gilbert; Douglas D. Smith, Mesa, both of Ariz.; David P. DiMarco, Hillsboro, Oreg.

[73] Assignee: Motorola, Inc., Schaumburg, Ill.

[21] Appl. No.: 43,078

[22] Filed: Apr. 5, 1993

[51] Int. Cl.$^5$ ............... H03K 19/0948; H03K 19/096
[52] U.S. Cl. ..................................... 326/106; 326/122
[58] Field of Search ............... 307/463, 272.2, 452, 307/494, 463, 449

[56] References Cited

U.S. PATENT DOCUMENTS

| | | | |
|---|---|---|---|
| 4,825,104 | 4/1989 | Yamakoshi et al. | 307/494 |
| 5,237,217 | 8/1993 | Hasegawa et al. | 307/463 |
| 5,291,076 | 3/1994 | Bridges et al. | 307/449 |

Primary Examiner—Edward P. Westin
Assistant Examiner—Benjamin D. Driscoll
Attorney, Agent, or Firm—Gary W. Hoshizaki

[57] ABSTRACT

A configurable decode circuit (11) having a plurality of inputs (12), a clock input (13), an output (14), and an output (16) is described. The configurable decode circuit (11) is a nor type decoder configurable to different address widths. A latch (17) stores the decode results. A bias circuit (29) enables the configurable decode circuit (11) starting a decode cycle. A differential input stage is coupled between the latch (17) and bias circuit (29). One side of the differential input stage comprises a plurality of transistors (23) coupled in parallel. Each control electrode of the plurality of transistors (23) is coupled to a respective input of inputs (12). The other side of the differential input stage comprises a transistor (28) coupled between the latch (17) and the bias circuit (29). A control electrode of the transistor (28) is coupled to common first electrodes of the plurality of transistors (23).

19 Claims, 2 Drawing Sheets

DECODER AND LATCHING CIRCUIT WITH DIFFERENTIAL OUTPUTS

BACKGROUND OF THE INVENTION

This invention relates, in general, to decode circuits, and more particularly to configurable decode circuits for compiler applications.

A compiler is a program which generates a layout and simulation model of a circuit based on parameters input by the user. For example, a user of a static ram (SRAM) compiler inputs such parameters as word width, memory size (number of bits needed), and block size. The compiler then generates all the needed files to simulate and fabricate the SRAM with other blocks that comprise the entire integrated circuit. The key to compilers is the flexibility afforded the user to tailor the compiled circuit such as the SRAM example for a specific circuit application. Time is also a factor, compilers are extremely fast and typically do not add significant time to the design cycle of an integrated circuit.

There are tradeoffs to creating a circuit compiler and using compiler generated circuits. Compilers are extremely complex programs at best, to alleviate problems in creating a compiler, many circuit designs are simplified or modified to lend themselves to a compilable format. Generally, a compiler generated circuit does not have the equivalent performance or density of a full custom designed circuit. This is especially true for memory compilers.

A fundamental component of any memory are the decode circuits. Memory architecture's are typically broken into memory rows, columns, and blocks. Decode circuits determine which row, column, and block is accessed to read or write to the appropriate memory bit or word. It is well known by those skilled in the art that nand and nor decoders have been widely used in memory compilers. Nand and nor decoders are not easily expandable or compilable for varying address widths. Multiple stages of decoding is inherent in the nand/nor decode architecture increasing program complexity. Nand and nor decoders have high capacitance per decode stage which loads clock driver circuits reducing performance. Performance of nand and nor decoders also decreases as the number of decoder inputs increase. It would be of great benefit if a decode circuit was developed which simplifies compiler complexity and increases decode performance.

SUMMARY OF THE INVENTION

Briefly stated, a configurable decode circuit and method is provided. The configurable decode circuit having a plurality of inputs, a clock input, a first output, and a second output. The configurable decode circuit comprises a latch, a plurality of transistors coupled in parallel, a transistor, and a bias circuit. The latch has a first and second output coupled to the first and second output of the configurable decode circuit, respectively, and a first terminal and a second terminal. The plurality of transistors are of a first conductivity type and have common first electrodes and common second electrodes. The common first electrodes are coupled to the first terminal of the latch. The transistor is of the first conductivity type and has a control electrode coupled to the first terminal of the latch, a first electrode coupled to the second terminal of the latch, and a second electrode coupled to the common second electrodes of the plurality of transistors. The bias circuit has a first terminal coupled to the second electrode of the transistor and a second terminal coupled to the clock input of the configurable decode circuit.

DETAILED DESCRIPTION OF THE DRAWINGS

Figure 1:
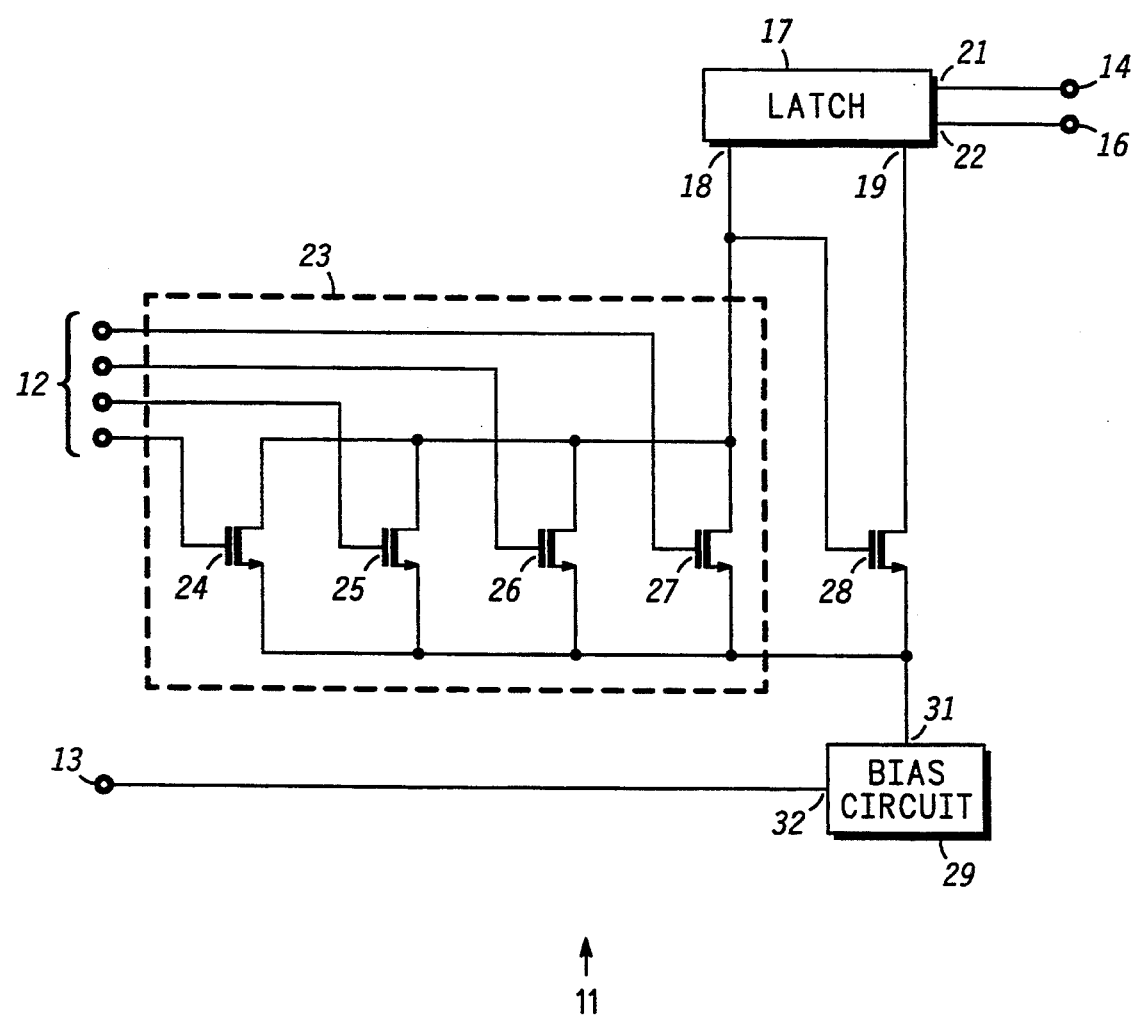
FIG. 1 is a partial schematic and block diagram of a configurable decode circuit in accordance with the present invention.

FIG. 1 is a partial schematic and block diagram of a configurable decode circuit in accordance with the present invention.

It is well known by those skilled in the art that a decode circuit generates an enable or disable signal based on an address input to the decode circuit. Generally, the decode circuit responds with an enable signal when a unique address is input, all other addresses generate a disable response. One common application for decode circuits is in a memory. The decode circuits are used to access a specific memory bit or word. Each bit or word is identified by a unique address.

A compiler is a computer program which automatically generates a circuit, such as a memory, based on inputs from the user. The compiler increases design flexibility by allowing the user to build a circuit to the specific parameters needed for the application. Circuits for compilers, generally compromise between flexibility and performance. For example, most compilable decode circuits are designed to simplify layout at the expense of performance to facilitate the task of building the layout portion of the compiler.

A configurable decode circuit 11 that is easily compilable and has excellent performance is illustrated in FIG. 1. Configurable decode circuit 11 includes a plurality of inputs 12, a clock input 13, an output 14, and an output 16. Configurable decode circuit 11 comprises a plurality of transistors 23, a transistor 28, a bias circuit 29, and a latch 17. Bias circuit 29 has a terminal 31 for providing current to configurable decode circuit 11 and a terminal 32 coupled to clock input 13. Transistors 23 comprises a transistor 24, 25, 26, and 27 coupled in parallel. The four transistors 24–27 that comprise transistors 23 are for illustration purposes only, the actual number of transistors is a function of the specific decode application. Transistors 23 is the only random variable when configuring decode circuit 11, all other components are fixed. Transistors 23 are coupled in parallel which simplifies layout. The number of transistors 23 needed for a specific application are tiled together.

In the preferred embodiment, transistors 24–27 and transistor 28 are n-channel enhancement MOSFETs (metal oxide semiconductor field effect transistors) having a gate, drain, and source corresponding respectively to a control electrode, first electrode, and a second electrode. N-channel transistors correspond to a first conductivity type. It should be obvious to those skilled in the art that a complementary version could be formed and other transistor types could be used. The drains of transistors 24–27 are coupled in common and the sources of transistors 24–27 are coupled in common to terminal 31 of bias circuit 29. Each gate of transistors 24–27 are coupled to a respective input of inputs 12.

Transistor 28 has a gate coupled to the common drains of transistors 24–27 and a source coupled to terminal 31 of bias circuit 29. Latch 17 stores a logic state during a decode cycle, latch 17 has a terminal 18 coupled to the common drains of transistors 24–27, a terminal 19 coupled to the drain of transistor 28, an output 21 coupled to output 14, and an output 22 coupled to output 16. Output 14 and output 16 are complementary outputs. Latch 17 translates and stores a difference voltage generated at terminals 18 and 19 during the decode cycle and outputs complementary logic states at outputs 14 and 16 which correspond to the status of an address applied to inputs 12.

Configurable decode circuit 11 is a "nor" type decoder. A digital logic signal is applied to each input of plurality of inputs 12. Four inputs are shown for inputs 12 in FIG. 1 for illustration purposes only. Configurable decode circuit 11 is "configurable for a specific application" to provide as many inputs as appropriate for inputs 12. In the preferred embodiment, the collective signals that are applied to inputs 12 form an address, each signal is known as an address signal. Configurable decode circuit 11 having "n-inputs" has $2^n$ possible address combinations being applied. Sixteen address combinations are possible for the specific example shown in FIG. 1 having four inputs comprising inputs 12. Generally, a nor type decoder generates an enable logic state (meaning the address corresponds to the decoder) for only a single address of the total number of possible address combinations. The nor type decoder generates a disable logic state (meaning the address does not correspond to the decoder) for all other addresses.

In the preferred embodiment, configurable decode circuit 11 is synchronous. A clock signal is applied to clock input 13 to start the decode cycle. Address signals applied to inputs 12 are in a stable logic state prior to the decode cycle. A differential input stage is formed by plurality of transistors 23, transistor 28, and bias circuit 29. A differential voltage is generated across terminals 18 and 19 which sets latch 17 to a logic state. Operation of configurable decode circuit 11 is best described for the two logic states output, an enable logic state and a disable logic state.

An enable logic state is output at outputs 14 and 16 of configurable decode circuit 11 when all transistors of transistors 23 are disabled. In the preferred embodiment, prior to the decode cycle both terminals 18 and 19 of latch 17 are precharged to an equal voltage. The clock signal enables bias circuit 29 starting the decode cycle. Inputs 12 each receive an address signal in a zero logic state disabling transistors 23. Transistors 23 being disabled provides no current path from bias circuit 29 to terminal 18 to discharge the precharged voltage (terminal 18 remains at the precharged voltage). Transistor 28 is enabled, providing a current path from bias circuit 29 to discharge the precharged voltage at terminal 19. As the precharged voltage is discharged, a differential voltage is formed between terminals 18 and 19. Latch 17 stores the logic states developed at terminals 18 and 19 and outputs the logic states at outputs 14 and 16 that represents the enable logic state. In this example, output 14 is at a one logic state and output 16 is at a zero logic state.

A disable logic state is output at outputs 14 and 16 of configurable decode circuit 11 when at least one transistor (24–27) of transistors 23 is enabled. Similar to the previous example, terminals 18 and 19 are precharged to the equal voltage prior to the decode cycle. The clock signal enables bias circuit 29. Initially, the at least one transistor of transistors 23 which is enabled discharges terminal 18 at the same rate as transistor 28 discharges terminal 19. As terminal 18 discharges the gate to source voltage of transistor 28 is reduced (lowering drain current of transistor 28), thus the rate of change at terminals 18 and 19 is modified such that terminal 18 discharges faster than terminal 19 (terminal 18 discharging eventually turns off transistor 28). A differential voltage is generated between terminals 18 and 19. Latch 17 stores the logic states developed at terminals 18 and 19 and outputs the logic states at outputs 14 and 16 that represents the disable logic state. In this example, output 14 is at a zero logic state and output 16 is at a one logic state.

Figure 2:
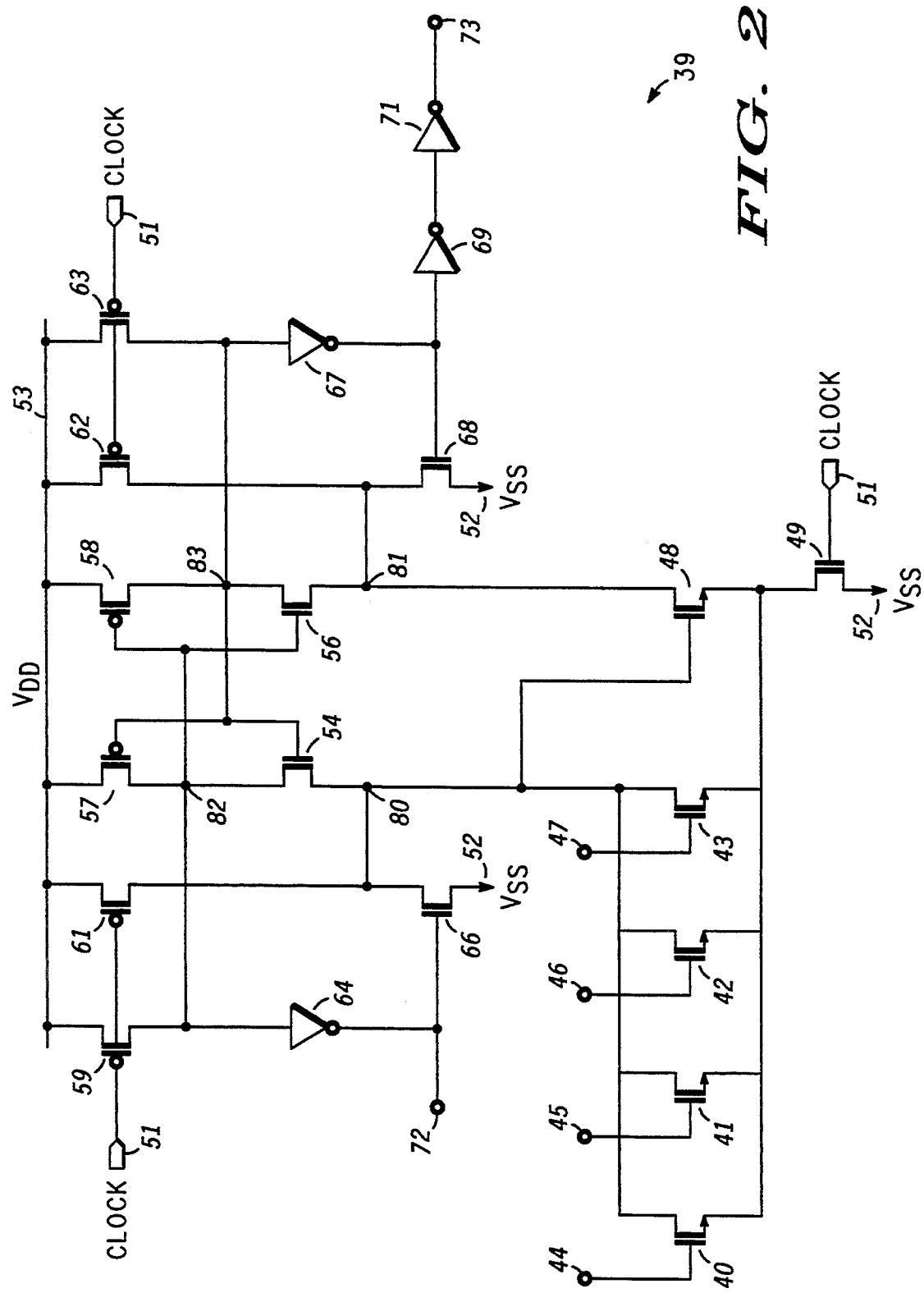
FIG. 2 is a schematic of a configurable decode circuit in accordance with the present invention.

FIG. 2 is a configurable decode circuit in accordance with the present invention. FIG. 2 is a further embodiment of the configurable decode circuit of FIG. 1.

A configurable decode circuit 39 is illustrated in FIG. 2. Configurable decode circuit has a plurality of inputs 44, 45, 46, and 47, a clock input 51, and outputs 72 and 73. Transistors 40, 41, 42, 43, 48, 49, 54, 56, 66, and 68 are n-channel enhancement MOSFETs, each having a gate, drain, and source corresponding respectively to a control electrode, first electrode, and second electrode. N-channel transistors correspond to a first conductivity type. Transistors 57, 58, 59, 61, 62, and 63 are p-channel enhancement MOSFETs, each having a gate, drain, and source corresponding respectively to a control electrode, first electrode, and second electrode. P-channel transistors correspond to a second conductivity type.

Transistors 40, 41, 42, and 43 correspond to plurality of transistors 23 of FIG. 1. Like transistors 23, the four transistors (40-43) shown in FIG. 2 are for illustration purposes only. The number of transistors is dependent on the specific decode application but parallel coupled transistors (40-43) are sufficient to show the basic configuration. Each drain of transistors 40-43 is coupled in common to a node 80 and each source of transistors 40-43 are coupled in common. The gates of transistors 40-43 are coupled respectively to inputs 44-47 of configurable decode circuit 39. Transistor 48 has a gate coupled to node 80, a drain coupled to a node 81 and a source coupled to the common sources of transistors 40-43. A bias circuit for configurable decode circuit 39 comprises transistor 49 having a gate coupled to clock input 51, a drain coupled to the common sources of transistors 40-43, and a source coupled to a terminal 52 of a first power supply. The first power supply outputs the negative most potential of the circuit. In this example, assume the first power supply outputs a ground or zero volt potential.

A latch comprises transistors 54, 56, 57, and 58. Transistor 54 has a gate coupled to a node 83, a drain coupled to a node 82, and a source coupled to node 80. Transistor 56 has a gate coupled to node 82, a drain coupled to node 83, and a source coupled to node 81. Transistor 57 has a gate coupled to node 83, a drain coupled to node 82, and a source coupled to a terminal 53 of a second power supply. The second power supply outputs the positive most potential of the circuit. Transistor 58 has a gate coupled to node 82, a drain coupled to node 83, and a source coupled to terminal 53 of the second power supply. The latch stores an enable or disable logic state produced during a decode cycle.

A plurality of precharge circuits comprising transistors 59, 61, 62, and 63 precharge nodes 80–83 prior to the decode cycle. Transistors 59, 61, 62, and 63 each have a source coupled to terminal 53 of the second power supply and a gate coupled to clock input 51. Transistor 59 precharges node 82 and has a drain coupled to node 82. Transistor 61 precharges node 80 and has a drain coupled to node 80. Transistor 62 precharges node 81 and has a drain coupled to node 81. Transistor 63 precharges node 83 and has a drain coupled to node 83.

Additional circuitry comprising inverters 64 and 67, and transistors 66 and 68 holds a low logic state at either node 80 or 81 after an address has been decoded. Transistors 66 and 68 have a high impedance when enabled such that precharge transistors 61 and 62 overdrive them to a one logic state prior to the decode cycle. Inverter 64 has an input coupled to node 82 and an output coupled to output 72 of configurable decode circuit 39. Transistor 66 has a gate coupled to the output of inverter 64, a drain coupled to node 80, and a source coupled to terminal 52 of the first power supply. Inverter 67 has an input coupled to node 83 and an output. Transistor 68 has a gate coupled to the output of inverter 67, a drain coupled to node 81, and a source coupled to terminal 52 of the first power supply. An inverter 69 and an inverter 71 buffer the output of inverter 67. Inverter 69 has an input coupled to the output of inverter of inverter 67 and an output. Inverter 71 has an input coupled to the output of inverter 69 and an output coupled to output 73 of configurable decode circuit 39.

In the preferred embodiment, configurable decode circuit 39 is a synchronous circuit. A clock signal applied to clock input 51 initiates the decode cycle. The clock signal has a low phase and a high phase. Precharging occurs during the low phase of the clock signal. Transistors 59, 61, 62, and 63 are enabled by the clock signal precharging nodes 80-83 to a one logic state. The outputs of both inverter 64 and 67 are at a zero logic state, respectively disabling transistors 66 and 68. An address comprising a plurality of address signals is applied to inputs 44-47. The logic state of each address signal stabilizes prior to the high phase of the clock signal (or decode cycle).

Configurable decode circuit 39 generates an "enable" or "disable" logic state at outputs 72 and 73 based on the address applied to inputs 44-47. In the preferred embodiment, a unique address generates the enable logic state, all others generate a disable logic state. The enable logic state corresponds to a zero logic state at output 72 and a one logic state at output 73. The enable logic state occurs when transistors 40-43 are disabled, in other words, each address signal applied to inputs 44-47 is in a zero logic state. The disable logic state corresponds to a one logic state at output 72 and a zero logic state at output 73. The disable logic state occurs when at least one of transistors 40-43 is enabled, in other words, at least one address signal of the address is in a one logic state.

Decoding starts when the clock signal is in the high phase. The address is processed and configurable decode circuit 39 outputs either the enable or disable logic state. The high phase of the clock signal disables precharge transistors 59, 61, 62, and 63. Operation of configurable decode circuit 39 is described for the two possible outputs. The enable logic state is generated when each address signal applied to inputs 44-47 are in a zero logic state. Transistors 40-43 are disabled. Transistor 49 is enabled by the clock signal. Transistor 48 is enabled by the precharge voltage at node 80. Transistor 56 is enabled by the precharge voltage on node 82. Current through enabled transistors 48, 49, 56 discharges node 81 and node 83. As node 83 is discharged transistor 57 is enabled holding node 82 in a one logic state and transistor 54 is disabled. Output 72 remains in a zero logic state. Node 83 in a zero logic state causes inverter 67 to output a one logic state. A one logic state is produced at output 73 though inverters 69 and 71. The latch comprising transistors 54, 56, 57, and 58 hold the enable logic state. Transistor 68 is enabled by the one logic state at the output of inverter 67 holding node 81 at the zero logic state. This prevents any of the address signals (changing to a one logic state) from corrupting the enable logic state stored in the latch.

The configurable decode circuit 39 generates the disable logic state when at least one of transistors 40-43 is enabled during the high phase of the clock. Similar to the previous example, transistor 49 and 48 are enabled discharging node 81. This example differs by the fact that the at least one enabled transistor of transistors 40-43 also discharges node 80. The gate voltage of transistor 48 is reduced as node 80 discharges thereby reducing transistor 48 drive. Node 80 discharges faster than node 81, thus node 82 discharges faster than node 83. Transistor 58 is enabled before transistor 57 driving node 83 to a one logic state. Node 80 continues to discharge turning transistor 48 off. A zero logic state at node 82 produces a one logic state at output 72 by inverter 64. A one logic state at node 83 produces no change and the output of inverter 67 and output 73 remain in a zero logic state. The latch holds the disable logic state of configurable decode circuit 39. The one logic state at output 72 enables transistor to hold node 80 in a zero logic state. This prevents the address signals (all changing to a zero logic state) from corrupting the disable logic state stored in the latch.

Configurable decode circuit 39 is easily compilable because the lone variable is the number of transistors (illustrated by transistors 40-43) needed to accommodate the address. It should be obvious to those skilled in the art that from a layout perspective it would be easy to add or delete parallel coupled transistors. Parasitic capacitance at the clock input is a serious concern when hundreds or thousands of decode circuits are used (each coupled to the clock driver). Capacitance at clock input 51 is minimized in configurable decode circuit 39 by reducing the number of elements which must be coupled to clock input 51 (precharge transistors 59, 61, 62, 63, and transistor 49). Storing the decoded address results in the latch provides a means for increasing decode speed by eliminating the need to allow address changes only during the low phase of the clock. Complementary outputs are provided by configurable decode circuit 39 but typically only a single output is utilized. Forming a complementary version of configurable decode circuit 39 and using other transistor types (such as bipolar or gallium arsenide transistors) should be obvious to those skilled in the art. By now it should be apparent that there has been provided a configurable decode circuit which is easily adaptable for various address widths, has reduced parasitic capacitance at the clock input, and stores the decode results in a latch.

We claim:

1. A configurable decode circuit including a plurality of inputs, a clock input, a first output, and a second output, the clock input receiving a clock signal, the configurable decode circuit comprising:

a latch for storing a logic state, said latch having a first terminal, a second terminal, a first output coupled to the first output of the configurable decode circuit, and a second output coupled to the second output of the configurable decode circuit;

a plurality of transistors of a first conductivity type coupled in parallel, each transistor of said plurality of transistors having a control electrode coupling to a corresponding input of the plurality of inputs of the decode circuit, a first electrode, and a second electrode, each first electrode of said plurality of transistors being coupled in common to said first terminal of said latch and each second electrode of said plurality of transistors being coupled in common;

a first transistor of said first conductivity type having a control electrode coupled to said first terminal of said latch, a first electrode coupled to said second terminal of said latch, and a second electrode coupled to each second electrode of said plurality of transistors; and a bias circuit having a first terminal coupled to said second electrode of said first transistor and a second terminal coupled to the clock input of the configurable decode circuit wherein said latch holds the outputs of said first and second outputs of said configurable decode circuit after the plurality of inputs have been decoded.

2. The configurable decode circuit of claim 1 wherein said first output, second output, first terminal, and second terminal of said latch are precharged to a substantially equal voltage.

3. The configurable decode circuit of claim 1 wherein each input of the plurality of inputs of the configurable decode circuit has a different address signal applied.

4. The configurable decode circuit of claim 3 wherein each address signal applied to each input of the plurality of inputs of the configurable decode circuit is in a stable logic state prior to an enabling clock signal.

5. The configurable decode circuit of claim 1 wherein said latch comprises:

a first transistor of said first conductivity type having a control input coupled to said first output of said latch, a first electrode coupled to said second output of said latch, and a second electrode coupled to said second terminal of said latch;

a second transistor of said first conductivity type having a control input coupled to said second output of said latch, a first electrode coupled to said first output of said latch, and a second electrode coupled to said first terminal of said latch;

a third transistor of a second conductivity type having a control electrode coupled to said first output of said latch, a first electrode coupled to said second output of said latch, and a second electrode coupled to a terminal of a power supply; and a fourth transistor of said second conductivity type having a control electrode coupled to said second output of said latch, a first electrode coupled to said first output of said latch, and a second electrode coupled to said terminal of said power supply.

6. The configurable decode circuit of claim 1 further including:

a first transistor of a second conductivity type for precharging said first output of said latch, said first transistor having a control electrode coupled to the clock input of the configurable decode circuit, a first electrode coupled to said first output of said latch, and a second electrode coupled to a terminal of a power supply; and a second transistor of said second conductivity type for precharging said second output of said latch, said second transistor having a control electrode coupled to the clock input of the configurable decode circuit, a first electrode coupled to said second output of said latch, and a second electrode coupled to said terminal of said power supply.

7. The configurable decode circuit of claim 1 further including:

a first transistor of a second conductivity type for precharging said first terminal of said latch, said first transistor having a control electrode coupled to the clock input of the configurable decode circuit, a first electrode coupled to said first terminal of said latch, and a second electrode coupled to a terminal of a power supply; and a second transistor of said second conductivity type for precharging said second terminal of said latch, said second transistor having a control electrode coupled to the clock input of the configurable decode circuit, a first electrode coupled to said second terminal of said latch, and a second electrode coupled to said terminal of said power supply.

8. The configurable decode circuit of claim 1 further including:

a first feedback circuit having an input coupled to said first output of said latch and an output coupled to said first terminal of said latch; and a second feedback circuit having an input coupled to said second output of said latch and an output coupled to said second terminal of said latch.

9. The configurable decode circuit of claim 8 wherein said first feedback circuit comprises:

an inverter having an input coupled to said first output of said latch and an output; and a first transistor of said first conductivity type having a control electrode coupled to said output of said inverter, a first electrode coupled to said first terminal of said latch, and a second electrode coupled to a terminal of a power supply.

10. The configurable decode circuit of claim 8 wherein said second feedback circuit comprises:

an inverter having an input coupled to said second output of said latch and an output; and a first transistor of said first conductivity type having a control electrode coupled to said output of said inverter, a first electrode coupled to said second terminal of said latch, and a second electrode coupled to a terminal of a first power supply.

11. The configurable decode circuit of claim 1 wherein said bias circuit comprises:

a first transistor of said first conductivity type having a control electrode coupled to said second terminal of said bias circuit, a first electrode coupled to said first terminal of said bias circuit, and a second electrode coupled to a terminal of a power supply.

12. A decode circuit including a plurality of inputs, a clock input, a first output, and a second output, each of the plurality of inputs receiving an address signal and the clock input receiving a clock signal, the decode circuit comprising:

a plurality of transistors of a first conductivity type coupled in parallel, each transistor of said plurality of transistors having a control electrode coupled to a corresponding input of the plurality of inputs of the decode circuit, a first electrode, and a second electrode, each first electrode of said plurality of transistors being coupled in common and each second electrode of said plurality of transistors being coupled in common;

a first transistor of said first conductivity type having a control electrode coupled to each first electrode of said plurality of transistors, a first electrode, and a second electrode coupled to each second electrode of said plurality of transistors;

a bias circuit having a first terminal coupled to said second electrode of said first transistor and a second terminal coupled to the clock input of the decode circuit;

a second transistor of said first conductivity type having a control input coupled to the first output of the decode circuit, a first electrode coupled to the second output of the decode circuit, and a second electrode coupled to said first electrode of said first transistor;

a third transistor of said first conductivity type having a control input coupled to the second output of the decode circuit, a first electrode coupled to the first output of the decode circuit, and a second electrode coupled to each first electrode of said plurality of transistors;

a first transistor of a second conductivity type having a control electrode coupled to the first output of the decode circuit, a first electrode coupled to the second output of the decode circuit, and a second electrode coupled for receiving a first supply voltage; and a second transistor of said second conductivity type having a control electrode coupled to the second output of the decode circuit, a first electrode coupled to the first output of the decode circuit, and a second electrode coupled for receiving said first supply voltage.

13. The decode circuit of claim 12 further including:
a third transistor of said second conductivity type for precharging the first output of the decode circuit, said third transistor having a control electrode coupled to the clock input of the decode circuit, a first electrode coupled to the first output of the decode circuit, and a second electrode coupled for receiving said first supply voltage; and a fourth transistor of said second conductivity type for precharging the second output of the decode circuit, said fourth transistor having a control electrode coupled to the clock input of the decode circuit, a first electrode coupled to the second output of the decode circuit, and a second electrode coupled for receiving said first supply voltage.

14. The decode circuit of claim 12 further including:
a third transistor of said second conductivity type for precharging said second electrode of said second transistor, said third transistor having a control electrode coupled to the clock input of the decode circuit, a first electrode coupled to said second electrode of said second transistor of said first conductivity type, and a second electrode coupled for receiving said first supply voltage; and a fourth transistor of said second conductivity type for precharging said second electrode of said third transistor, said fourth transistor having a control electrode coupled to the clock input of the decode circuit, a first electrode coupled to said second electrode of said third transistor of said first conductivity type, and a second electrode coupled for receiving said first supply voltage.

15. The decode circuit of claim 12 wherein said bias circuit comprises:
a first transistor of said first conductivity type having a control electrode coupled to said second terminal of said bias circuit, a first electrode coupled to said first terminal of said bias circuit, and a second control electrode coupled for receiving a second supply voltage.

16. The decode circuit of claim 12 further including:
a first feedback circuit having an input coupled to the first output of the decode circuit and an output coupled to said second electrode of said third transistor; and a second feedback circuit having an input coupled to the second output of the decode circuit and an output coupled to said second electrode of said second transistor.

17. The decode circuit of claim 16 wherein said first feedback circuit comprises:
an inverter having an input coupled to said input of said first feedback circuit and an output; and a first transistor of said first conductivity type having a control electrode coupled to said output of said inverter, a first electrode coupled to said output of said first feedback circuit, and a second electrode coupled for receiving said first supply voltage.

18. The decode circuit of claim 16 wherein said second feedback circuit comprises:
an inverter having an input coupled to said input of said second feedback circuit and an output; and a first transistor of said first conductivity type having a control electrode coupled to said output of said inverter, a first electrode coupled to said output of said second feedback circuit, and a second electrode coupled for receiving said first supply 19. A method for decoding a plurality of inputs comprising:
precharging a first and second terminal of a latch to a substantially equal voltage prior to a decode cycle, said substantially equal voltage corresponds to a first logic state;

providing a bias circuit for initiating said decode cycle;

coupling in parallel a plurality of transistors, between said first terminal of said latch and said bias circuit;

coupling a transistor between said second terminal of said latch and said bias circuit, said transistor being enabled by said first logic state at said first terminal of said latch;

enabling said bias circuit to initiate said decode cycle;

generating an enable logic state when each transistor of said plurality of transistors is disabled, said first logic state at said second terminal changes to a second logic state;

generating a disable logic state when at least one transistor of said plurality of transistors is enabled, said first logic state at said first terminal changes to a second logic state that disables said transistor;

storing said enable logic state and said disable logic state in said latch after the plurality of inputs have been decoded.

* * * * *